United States Patent
Chen et al.

(10) Patent No.: US 8,351,166 B2
(45) Date of Patent: Jan. 8, 2013

(54) LEAKAGE SENSOR AND SWITCH DEVICE FOR DEEP-TRENCH CAPACITOR ARRAY

(75) Inventors: Howard H. Chen, Yorktown Heights, NY (US); Kai D. Feng, Hopewell Junction, NY (US); Louis L. Hsu, Fishkill, NY (US); Seongwon Kim, Old Tappan, NJ (US)

(73) Assignee: International Business Machines Corporation, Armonk, NY (US)

( * ) Notice: Subject to any disclaimer, the term of this patent is extended or adjusted under 35 U.S.C. 154(b) by 634 days.

(21) Appl. No.: 12/508,665

(22) Filed: Jul. 24, 2009

(65) Prior Publication Data

US 2011/0019321 A1   Jan. 27, 2011

(51) Int. Cl.
*H01G 7/16* (2006.01)
*G01R 31/12* (2006.01)

(52) U.S. Cl. ........ 361/15; 361/301.1; 324/548; 324/522
(58) Field of Classification Search .................... 361/15, 361/301.1; 324/548, 522
See application file for complete search history.

(56) References Cited

U.S. PATENT DOCUMENTS

| | | | | |
|---|---|---|---|---|
| 5,488,301 | A * | 1/1996 | Werner et al. | 324/458 |
| 5,874,854 | A | 2/1999 | Skergan | 327/545 |
| 6,343,045 | B2 | 1/2002 | Shau | 365/227 |
| 6,677,637 | B2 * | 1/2004 | Bernstein et al. | 257/307 |
| 6,735,072 | B2 | 5/2004 | Liao | 361/306.2 |
| 6,882,015 | B2 | 4/2005 | Bernstein et al. | 257/379 |
| 7,215,127 | B1 * | 5/2007 | Lu | 324/548 |
| 7,268,632 | B2 * | 9/2007 | Bonaccio et al. | 331/17 |
| 7,317,345 | B2 | 1/2008 | Sanchez et al. | 327/527 |
| 7,480,006 | B1 * | 1/2009 | Frank | 348/374 |
| 2005/0245970 | A1 | 11/2005 | Erickson et al. | 607/2 |
| 2009/0040857 | A1 * | 2/2009 | McNeil et al. | 365/226 |

OTHER PUBLICATIONS

Chiang et al. "High-Temperature Leakage Improvement in Metal-Insulator-Metal Capacitors by Work-Function Tuning", Mar. 2007, IEEE Electron Device Letters, vol. 28, No. 3, pp. 235-237.*
Steven H. Voldman et al., TML: A Trench Leakage Monitor for a Four Megabit SPT DRAM Technology, IEEE Transactions on Semiconductor Manufacturing, vol. 4, No. 3, pp. 226-232 (Aug. 1991).

* cited by examiner

*Primary Examiner* — Rexford Barnie
*Assistant Examiner* — Zeev V Kitov
(74) *Attorney, Agent, or Firm* — Ido Tuchman; Anne V. Dougherty

(57) ABSTRACT

A high-density deep trench capacitor array with a plurality of leakage sensors and switch devices. Each capacitor array further comprises a plurality of sub-arrays, wherein the leakage in each sub-array is independently controlled by a sensor and switch unit. The leakage sensor comprises a current mirror, a transimpedance amplifier, a voltage comparator, and a timer. If excessive leakage current is detected, the switch unit will automatically disconnect the leaky capacitor module to reduce stand-by power and improve yield. An optional solid-state resistor can be formed on top of the deep trench capacitor array to increase the temperature and speed up the leakage screening process.

16 Claims, 8 Drawing Sheets

LEAKAGE SENSOR AND SWITCH DEVICE FOR DEEP-TRENCH CAPACITOR ARRAY

BACKGROUND OF THE INVENTION

1. Field of the Invention

The invention generally relates to the field of integrated circuit design, and more particularly to the design of a high-density deep-trench capacitor array, wherein a plurality of leakage sensor and switch devices are integrated so that capacitors with excessive leakage current can be detected and switched off to improve circuit reliability and yield.

2. Description of Background

Capacitor devices have been widely used in today's integrated circuits, such as phase-locked loop (PLL), charge pump, analog circuits, and electrostatic discharge (ESD) devices. As the silicon technology continues to advance and the number of on-chip devices continues to increase, high-density deep-trench capacitor arrays have been developed to provide switching current, reduce power supply noise, and protect signal integrity. However, as the dielectric film in the capacitor becomes thinner, the leakage current grows exponentially. Leakage current not only increases power consumption, but also jeopardizes power integrity and causes coupling and jitter problems for noise-sensitive devices such as PLL.

The leakage current of a capacitor generally increases as the operation time, temperature, and biased voltage increase. For instance, the measured leakage level of a good tantalum capacitor is in the range of 0.01 nA/µF·V. If the leakage current of a solid tantalum capacitor exceeds 10 nA/µF·V, it is generally considered defective and should be scrapped.

Many methods have been proposed to manufacture capacitors on chip. In U.S. Pat. No. 6,225,133, entitled "Method of manufacturing thin film capacitor," a dielectric film made of materials with high dielectric constants such as $Ta_2O_5$, $Bi_4Ti_3O_{12}$, and $BaMgF_4$ is used to reduce the leakage of thin film capacitors. In U.S. Pat. No. 5,125,138, entitled "Miniaturized monolithic multi-layer capacitor and apparatus and method for making same," various acrylates are used for the dielectric layers, with the number of layers ranging from a few to many thousands. In U.S. Pat. No. 7,193,262, entitled, "Low-cost deep trench decoupling capacitor device and process of manufacture," a trench-type decoupling capacitor structure is added to a base logic design. Since the trench is made directly in the silicon wafer and the sidewalls of the trench are used for the capacitor dielectric, the planar area of trench decoupling capacitors can be made fairly small.

SUMMARY OF THE INVENTION

In order to monitor and control the leakage and defects, a high-density deep trench capacitor array is designed and partitioned into separate modules. Each module can be defined as a row, a sub-array, a full array, or a cluster of arrays. To minimize stand-by power and disconnect the defective capacitors with high leakage current, each module is equipped with a leakage sensor and switch device.

One embodiment of the present invention is a capacitor leakage current tester. The capacitor tester includes a current mirror configured to sense a leakage current of at least one capacitor. The capacitor tester further includes a comparison unit comprising a transimpedance amplifier and a voltage comparator. The comparison unit is configured to determine if the leakage current is above a threshold value. A timer unit is also present and is configured to schedule sensing by the current mirror.

The capacitor leakage current sensor may include a switch unit to disconnect the capacitor from a charge source if the leakage current is above the threshold value. The capacitor leakage current sensor may include a set-reset latch storing a leaky state or a not-leaky state of the at least one capacitor. The capacitor leakage current sensor may include a heater proximate to the capacitor and configured to heat the capacitor during current leakage sensing by the current mirror.

Another embodiment of the present invention is an on-chip power decoupling system. The system includes a plurality of capacitor arrays. Each capacitor array includes a plurality of deep trench capacitors coupled in parallel circuit to a power supply. A sensing unit is configured to detect leakage current in the plurality of capacitor arrays. The sensing unit includes a plurality of current mirrors configured to sense the leakage current of each of the plurality of capacitor arrays. A switch unit is configured to disconnect a capacitor array of the plurality of capacitor arrays from the power supply if the leakage current of the capacitor array is above a threshold value.

The system may include a comparison unit comprising a transimpedance amplifier and a voltage comparator configured to determine if the leakage current is above a threshold value, and a timer unit configured to schedule sensing of each of the capacitor arrays by the current mirror.

Yet another embodiment of the invention is method for operating an on-chip power decoupling system. The method includes a sensing operation to sense a leakage current of at least one capacitor array via a current mirror circuit. The capacitor array includes a plurality of capacitors coupled in parallel circuit to a power supply. A comparing operation compares the leakage current of the capacitor array to a threshold value. A disconnecting operation disconnects the capacitor array from the power supply if the leakage current of the capacitor array is greater than the threshold value.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-10.

The present invention may be used to provide a modular capacitor array with a leakage current sensor and switch device to improve circuit reliability and yield. If a capacitor unit is found to be defective with excessive leakage current, it is disconnected. Depending on the projected yield of the chip, the deep trench capacitor array can be partitioned into an appropriate number of modules to reduce the area overhead. Each capacitor array module is independently monitored and controlled by a current mirror unit, a comparison unit, and a timer unit.

Figure 1:
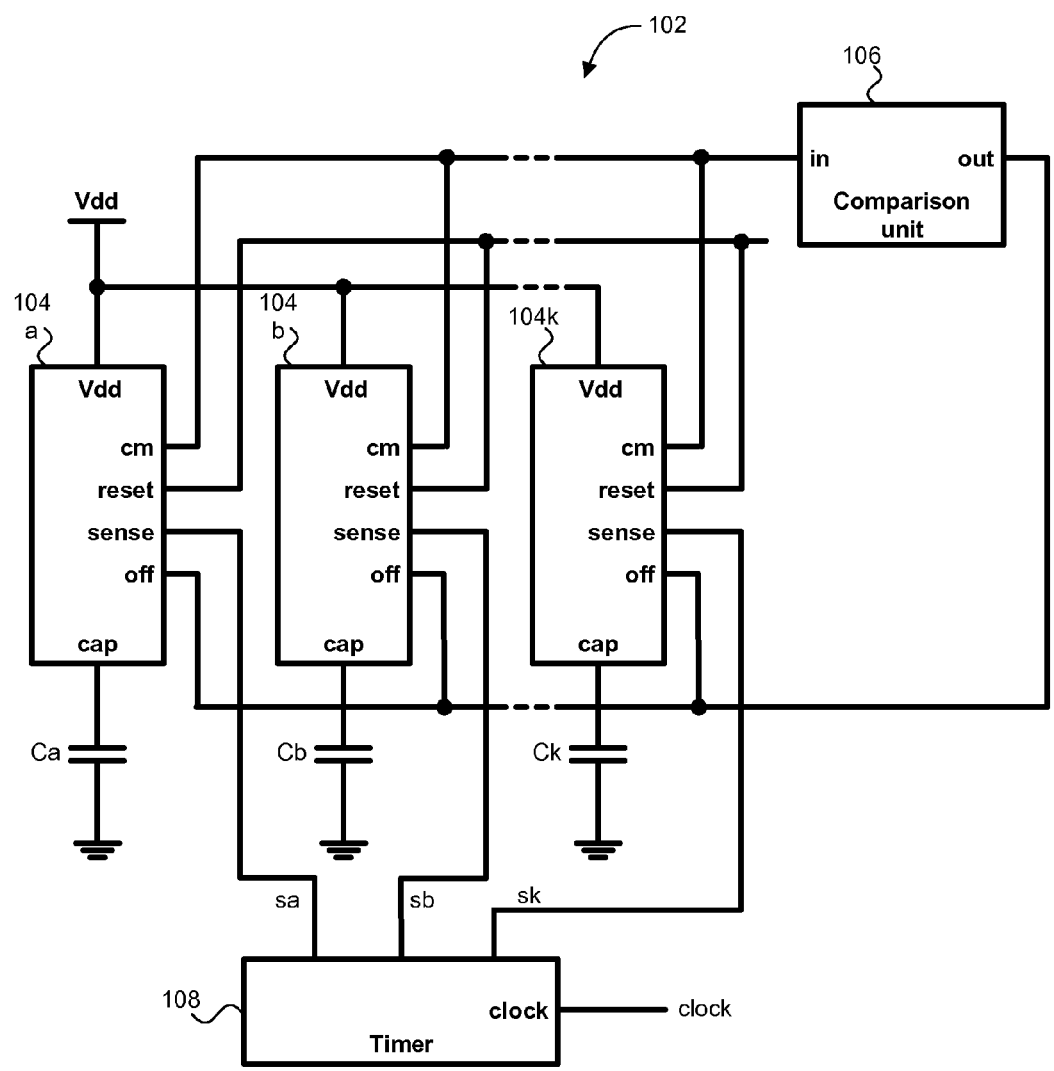
FIG. 1 illustrates the sensing unit to detect leakage current in decoupling capacitors.

An embodiment of the sensing unit 102 to detect the leakage current of decoupling capacitors is depicted in FIG. 1. As shown, leakage current sensor 104a is connected to decoupling capacitor Ca, leakage current sensor 104b is connected to decoupling capacitor Cb, and leakage current sensor 104k is connected to decoupling capacitor Ck. As discussed in more detail below, the detected leakage current is mirrored from the sensing circuits 104a, 104b, . . . , 104k to the comparison unit 106, where the mirrored current is converted by a transimpedance amplifier to a voltage that can be compared to a threshold voltage.

To schedule the sensing events in an orderly manner, a timer unit 108 is configured to schedule sensing by the current mirror. For example, the timer unit generates the sensing signals Sa, Sb, . . . , Sk to control the corresponding sensing events in circuits 104a, 104b, . . . , 104k.

Figure 2:
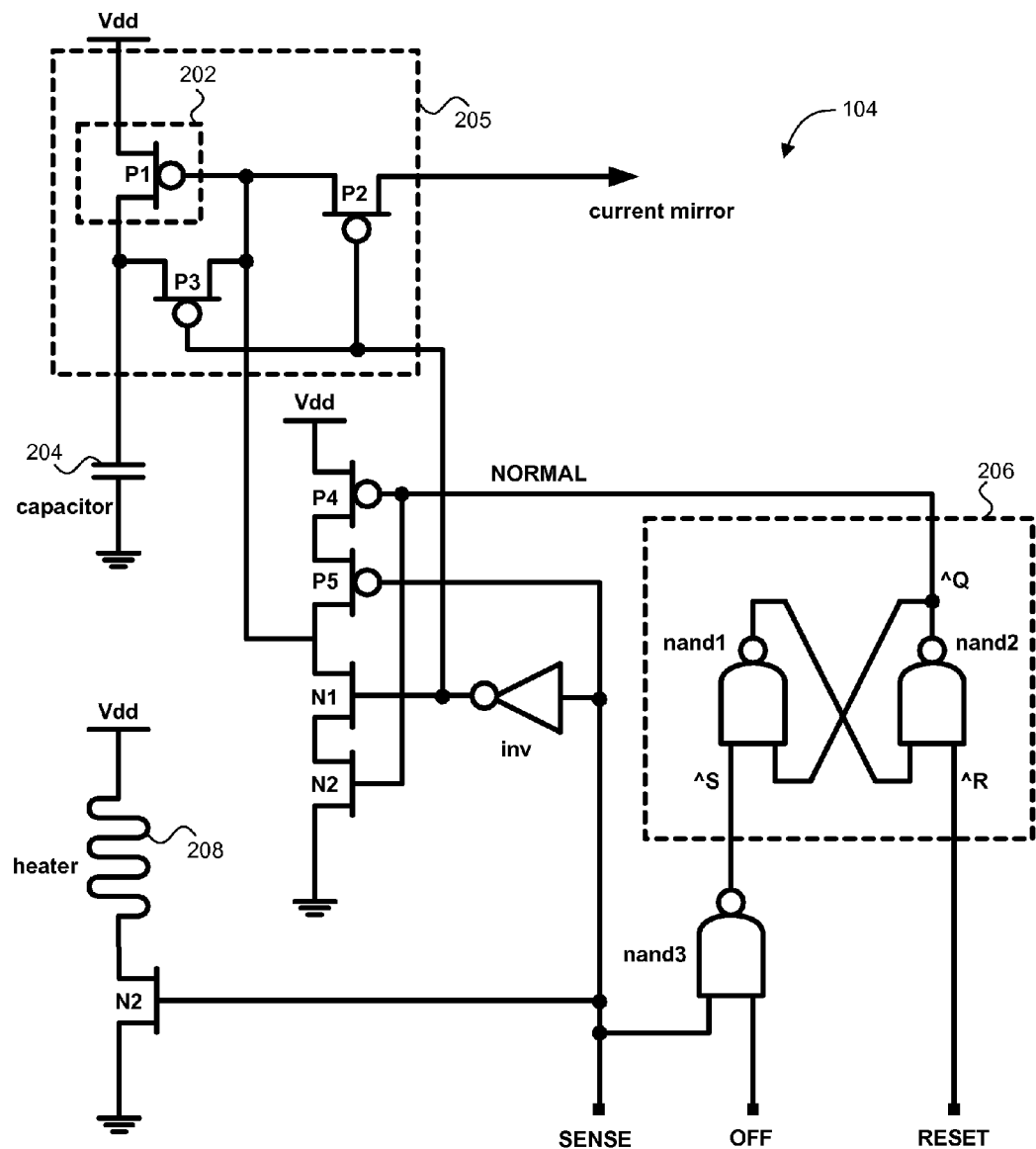
FIG. 2 illustrates the control unit for a primary side of current mirror.

FIG. 2 illustrates one implementation of a sensing unit 104. The decoupling capacitor 204, whose leakage current is to be monitored, is connected to power supply Vdd through a switch unit 202. The switch unit 202 is configured to disconnect the capacitor from a charge source during non-sensing mode if the leakage current is above the threshold value. As used herein, "disconnecting" the capacitor 204 or a capacitor array means placing at least a 10-Megaohm resistive path between the capacitor (array) and the power supply. The switch unit 202, for example, can be a large p-channel field effect transistor (pFET) P1. The large size of this pFET is designed to provide a low-impedance path between Vdd and the decoupling capacitor 204 when device P1 is on, and a relatively small gate-to-drain parasitic capacitance when device P1 is off.

The sensing unit 104 includes a primary side of a current mirror 205. The current mirror 205 is configured to sense a leakage current of the capacitor 204. Thus, in the non-sensing mode, P2 and P3 are turned off, and P1 acts as a switch. In the sensing mode, P2 and P3 are turned on, and the combination of P1, P2 and p3 is the primary side of the current mirror 205.

During sensing mode, the SENSE signal is set to logic 1, which turns off transistors P5 and N1, turns on transistors P2 and P3, and connects P1 as the input source for the primary side of a current mirror. During non-sensing mode, the SENSE signal is set to logic 0, which turns on transistors P5 and N1, and turns off transistors P2 and P3. If the NORMAL signal is set to logic 1 during non-sensing mode, it will turn off transistor P4 and turn on transistor N2, which triggers device P1 to be turned on, and connects the decoupling capacitor 204 to Vdd. On the other hand, if the NORMAL signal is set to logic 0 during non-sensing mode, it will turn off transistor N2 and turn on transistor P4, which triggers device P1 to be turned off, and disconnects the decoupling capacitor from Vdd.

The two NAND gates (nand1 and nand2) serve as a set-reset latch 206 to store the leakage state of the decoupling capacitors and may be coupled to the switch unit 202. In particular, the set-reset latch stores a leaky state or a not-leaky state of the capacitor 204. Once the capacitor 204 is determined to be leaky, it is continuously disconnected from the charge source until the set-reset latch is reset.

During the sensing mode, the SENSE signal is set to logic 1 and the leakage current of decoupling capacitor 204 is mirrored from device P1 to the comparison unit 106 (see FIG. 1). If the leakage current does not exceed the limit, the OFF signal from the output of the comparison unit 106 will be set to logic 0. As a result, the ^S signal from the output of device nand3 is set to logic 1, and the NORMAL signal from the ^Q output of device nand2 will be kept at its present state. On the other hand, if the leakage current exceeds the limit during sensing mode, the OFF signal from the output of the comparison unit 106 will be set to logic 1. As a result, the ^S signal from the output of device nand3 is set to logic 0, which in turn sets the NORMAL signal from the ^Q output of device nand2 to logic 0. Once the NORMAL signal is set to logic 0, it will not change its state until a reset signal ^R of logic 0 is received during the next power-on, which prevents any undesirable circuit oscillation.

The sensing unit 104 may include a heater 208 proximate to the capacitor 204 and configured to heat the capacitor 204 during the current leakage sensing by the current mirror. In one configuration, the heater 208 is a resistor having a serpentine pattern. It is contemplated the heater 208 raises the temperature of the capacitor 204 above 75° C. In a particular embodiment, the heater 208 is configured to heat the capacitor to a temperature between 80° C. and 130° C. during leakage current sensing. Heating the capacitor 204 helps speed up the leakage screening process.

Figure 3:
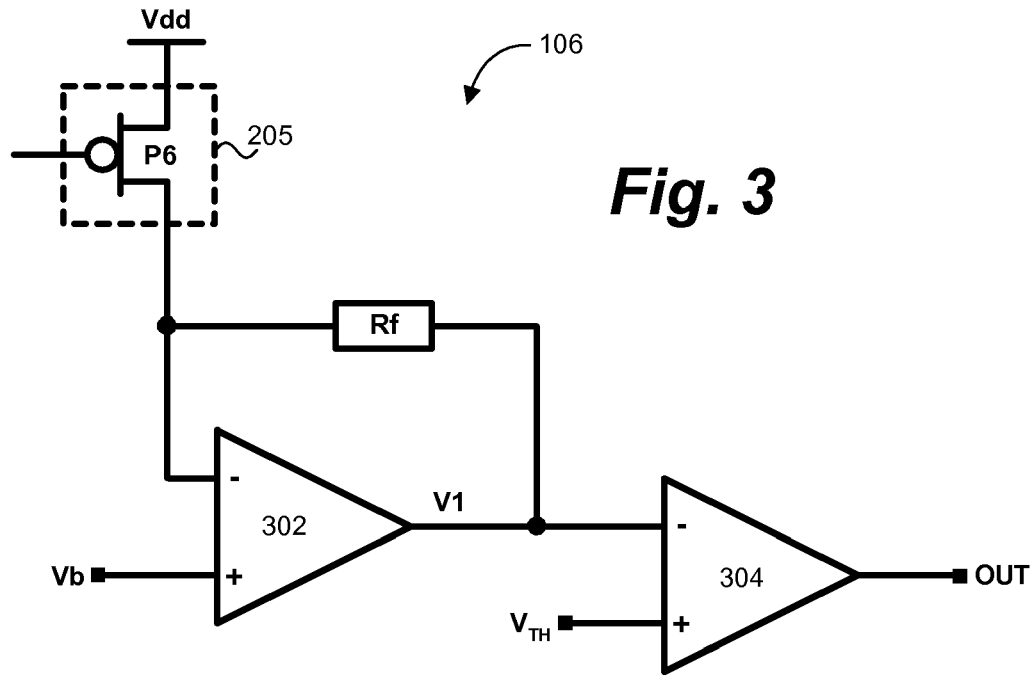
FIG. 3 illustrates a secondary side of a current mirror, transimpedance amplifier and a voltage comparator.

FIG. 3 depicts an example comparison unit 106 comprising a transimpedance amplifier 302 and a voltage comparator 304 configured to determine if the leakage current is above a threshold value. The comparison unit 106 includes a secondary side of the current mirror. Transistor P6 is a large pFET that outputs the mirrored current on the secondary side of the current mirror 205. The transimpedance amplifier 302 is connected to a feedback resistor Rf so that the input current can be converted into an output voltage V1=Vb−I*Rf. The high-gain and low-bandwidth characteristics of a transimpedance amplifier 302 allow the amplifier to filter out the glitches from device P6. An optional feedback capacitor can also be added across Rf to improve its stability. When the input current is 0, the output voltage of the transimpedance amplifier 302 is equal to the bias voltage Vb. As the input current increases, the output voltage of the transimpedance amplifier 302 will be decreased. The voltage comparator 304 is used to compare the output voltage from the transimpedance amplifier 302 to a threshold voltage. When the leakage current is small and the output voltage from the transimpedance amplifier 302 is higher than the threshold voltage $V_{TH}$, the output of the voltage comparator 304 is set to logic 0. When the leakage current is large and the output voltage from the transimpedance amplifier 302 is lower than the threshold voltage $V_{TH}$, the output of voltage comparator 304 is set to logic 1. The OFF signal of logic 1 from the output of voltage comparator 304 will in turn trigger the ^S^R latch in the set-reset latch 206 (see FIG. 2) to set the NORMAL signal to 0 and turn off device P1 to disconnect the leaky decoupling capacitor.

Figure 4:
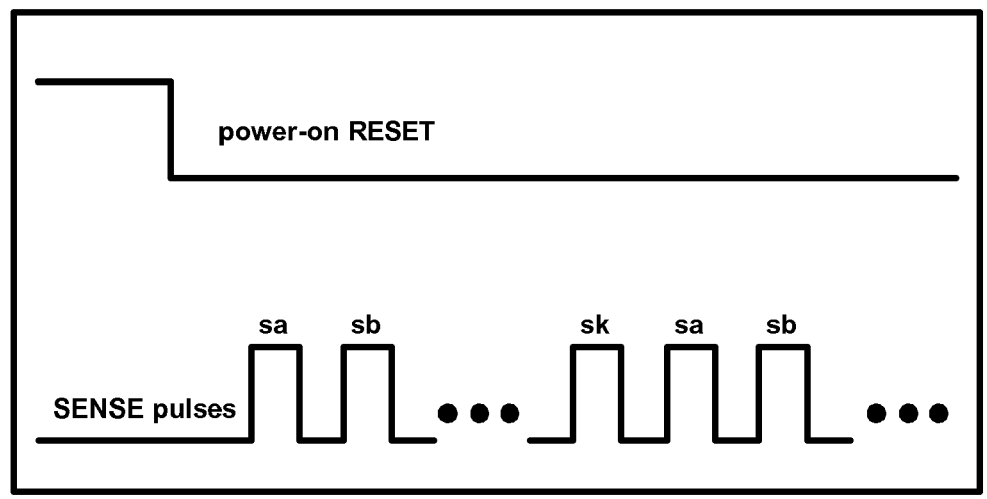
FIG. 4 shows RESET and SENSE control signals.

FIG. 4 illustrates the power-on RESET signal and the SENSE pulses generated by the timer unit 108. Since excessive leakage current in decoupling capacitors usually develops over time, the leakage current does not need to be monitored all the time. A timer unit 108 can schedule the sensing events by generating sequential sensing signals Sa, Sb, . . . , Sk to the corresponding sensing circuits 104a, 104b, . . . , 104k (see FIG. 1). Although the impedance of device P1 is relatively high during the sensing mode, the sensing pulses generated by timer unit 108 effectively limit the duration of sensing operation in each capacitor branch. Since other branches of the decoupling capacitors are still connected in parallel, the sequential scheduling of sensing one capacitor branch at a time will not have any significant impact on circuit performance. Furthermore, when the decoupling capacitors are initially charged during system power-on, the large current that flows through decoupling capacitors is part of the normal operation, instead of leakage current. Therefore, the leakage sensing events will not be scheduled until the power-on operation is complete.

As mentioned, an optional heater made of polysilicon or metal resistor can be built adjacent to the capacitors so that during the sensing operation, it will boost the leaky rate of the capacitor and more effectively switch off the defective capacitors. Polysilicon and metal resistors can be formed on back end of line (BEOL) layers above the deep trench capacitor array. A current source is then applied to the narrow serpentine wires to generate the heat up to 150° C.

Figure 5:
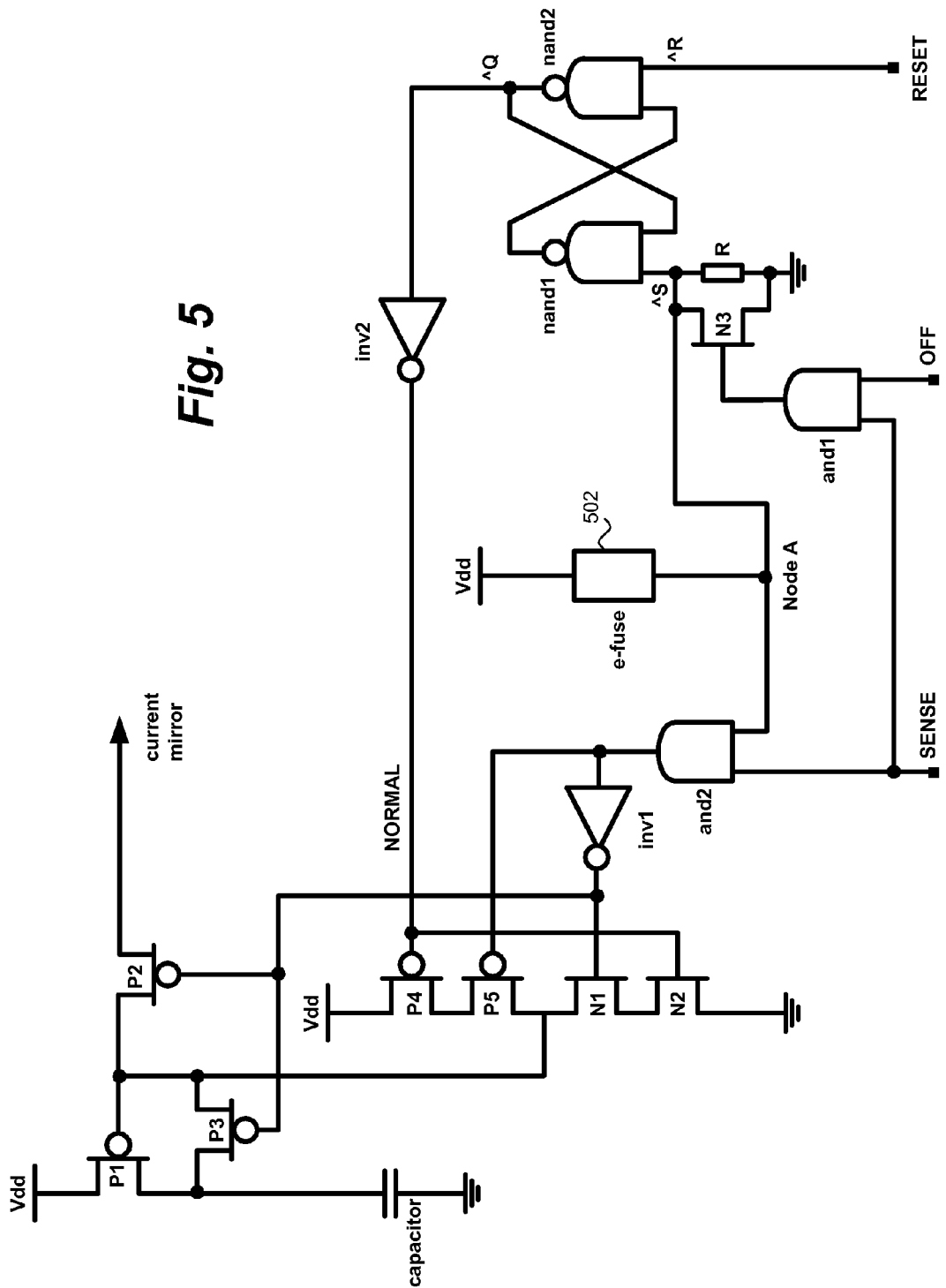
FIG. 5 illustrates a second sensing unit with permanent leakage control by an e-fuse.

If the excessive leakage current in decoupling capacitors is a recoverable event, a RESET signal can be generated during the next system power-on to reconnect the disconnected decoupling capacitors back to the power supply. However, if the decoupling capacitor cannot recover from excessive leakage, it should be disconnected permanently from the power supply. FIG. 5 illustrates another embodiment of the present invention, where an electronic fuse (efuse) 502 is used to permanently disconnect the decoupling capacitors if necessary.

The resistance of an e-fuse 502 is low before it is burned, and high after it is burned. A resistor R is connected between the e-fuse and the ground. Node A, which connects resistor R and e-fuse 502 to the inputs of gates nand1 and and2, is set to logic 1 before the e-fuse is burned, and set to logic 0 after the e-fuse is burned. When excessive leakage current is detected during sensing mode, the SENSE and OFF signals will both be set to logic 1, which turns on transistor N3 and burns the e-fuse 502.

The burned e-fuse 502 sets node A to logic 0, which in turn sets the output of nand1 to logic 1 and the NORMAL signal to logic 0. Since node A is permanently kept at logic 0 after the e-fuse 502 is burned, the NORMAL signal is permanently set to logic 0 and the output of gate and2 is permanently set to logic 0, which turns off transistor P1 and permanently disconnects the leaky decoupling capacitor even after the system is powered off and powered back on.

Figure 6:
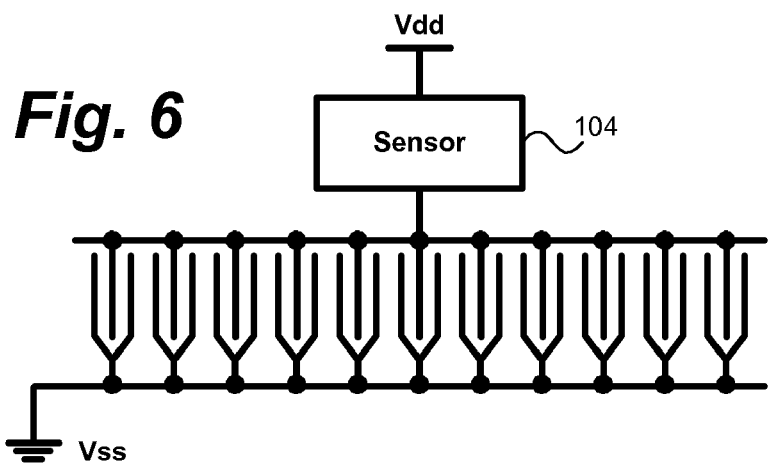
FIG. 6 illustrates an implementation of leakage sensing and switch devices for each row of deep-trench capacitors.

FIG. 6 shows an embodiment of the invention wherein the leakage sensor unit 104 is implemented for each row of deep-trench decoupling capacitors that are connected in parallel. It is optional to add a poly-silicon resistor near the deep-trench capacitors to heat up the devices and enhance leakage detection during the test mode.

Figure 7:
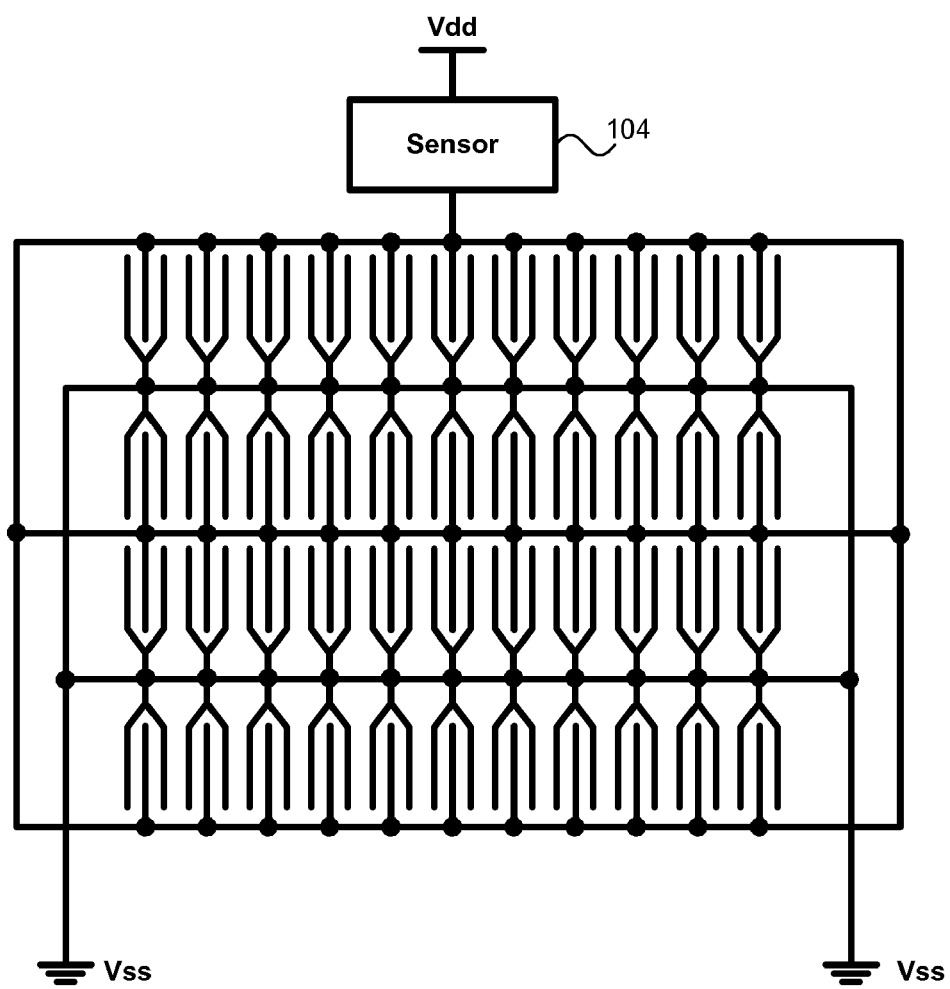
FIG. 7 illustrates an implementation of a single leakage sensing and switch device for each array of deep-trench capacitors.

FIG. 7 shows another embodiment where a leakage sensor unit 104 is provided for each deep-trench decoupling capacitor array. It is to be understood that such sensor and switch circuit units can be provided on either the Vdd or Vss side of the array.

Figure 8:
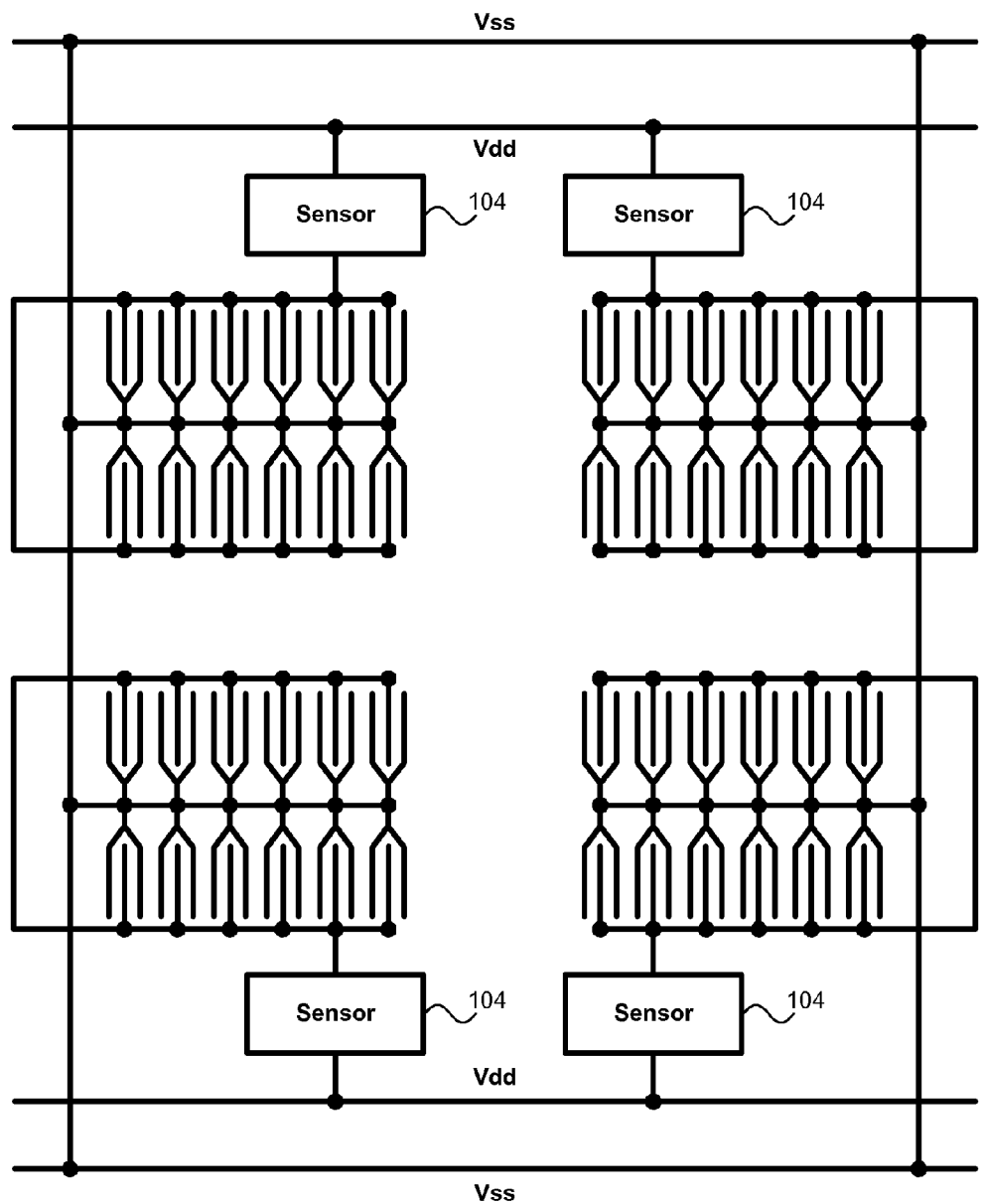
FIG. 8 illustrates an implementation of multiple leakage sensing and switching devices for a deep-trench capacitor array.

FIG. 8 shows another embodiment wherein the leakage from a portion of a full array can be separately sensed and switched off if necessary. To optimize circuit layout efficiency, the sensing and switching devices can be placed on both sides of the array.

Figure 9:
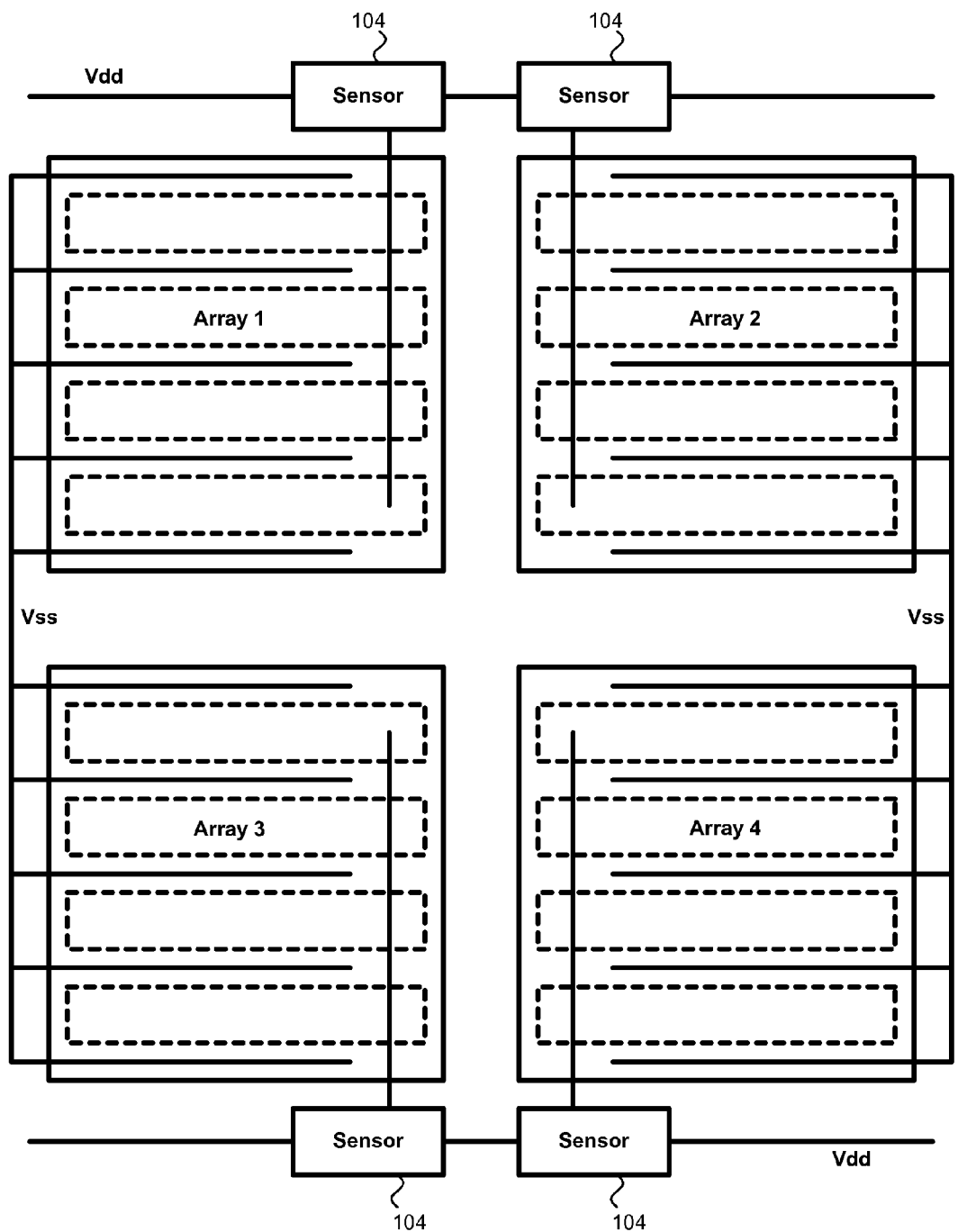
FIG. 9 shows an on-chip partition with multiple deep-trench capacitor arrays.

FIG. 9 shows a chip comprising a plurality of deep trench capacitor arrays wherein each array is equipped with at least one leakage sensing and switching unit 104.

Figure 10:
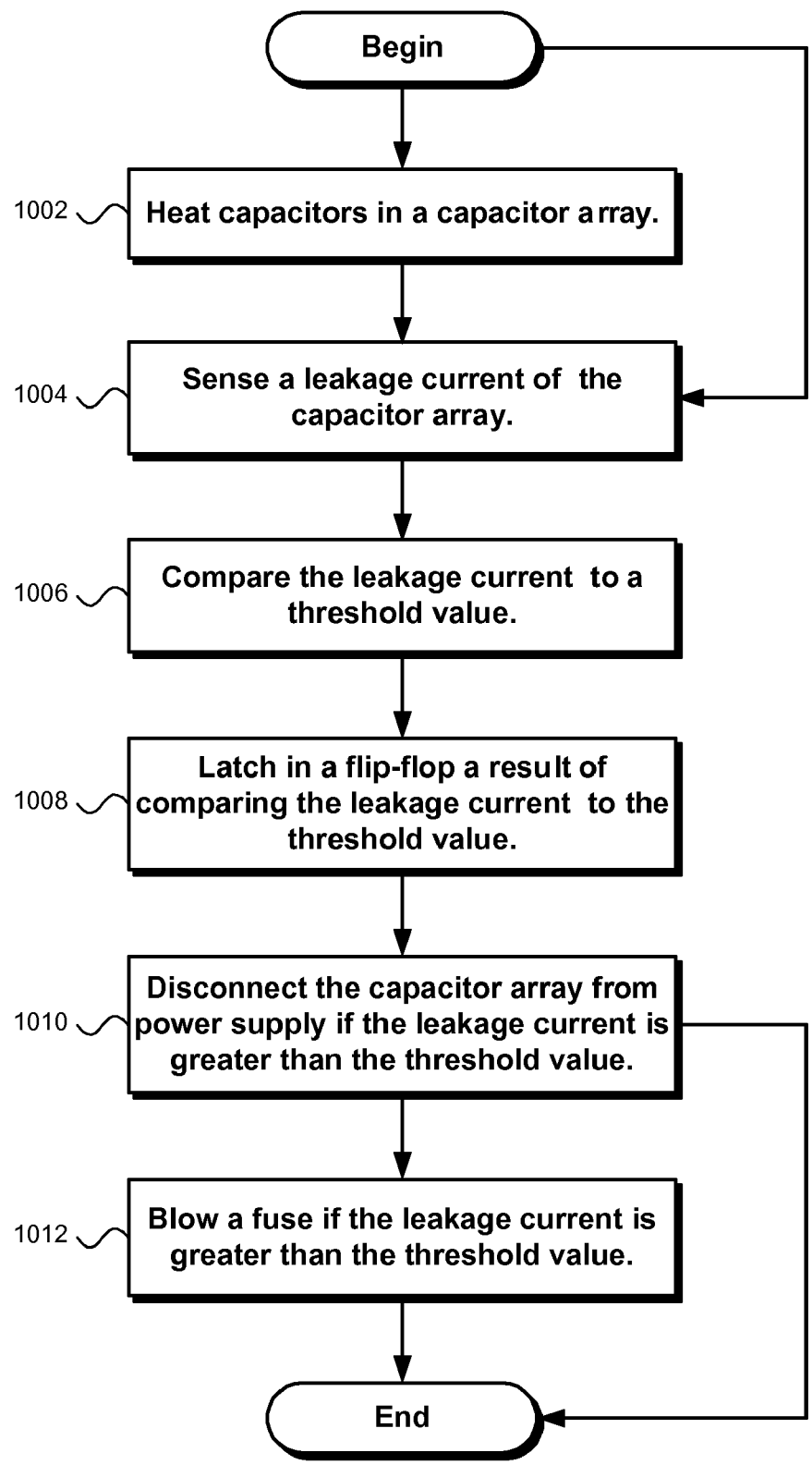
FIG. 10 shows a flowchart for operating an on-chip power decoupling system contemplated by the invention.

FIG. 10 shows an example flowchart for operating an on-chip power decoupling system contemplated by the present invention. Those skilled in the art will appreciate that some operations may be performed by hardware, while other operations may be performed by one or more computer processors executing software. Such a processor may be a general purpose processor or a specialized processor, such as a state machine. Computer program instructions executed by the processor may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Process flow may begin with optional heating operation 1002, or proceed directly to sensing operation 1004. During the heating operation, the capacitors under test are heated to a temperature between 80° C. and 130° C. As mentioned above, a solid-state resistor formed over the deep trench capacitor array may be used to increase the temperature and speed up the leakage screening process. After the heating operation 1002 is completed, control passes to sensing operation 1004.

At sensing operation 1004, a leakage current of at least one capacitor array is sensed via a current mirror circuit. The capacitor array includes a plurality of capacitors coupled in parallel circuit to a power supply. As discussed above, sensing the leakage current occurs periodically using a timing unit. In this manner, a single comparison unit can check the leakage current of many capacitor arrays. In a particular embodiment, a current mirror circuit is used to sense the leakage current of the capacitor array. After the sensing operation 1004 is completed, control passes to comparing operation 1006.

At comparing operation 1006, the leakage current of the capacitor array is compared to a threshold value. As detailed above, a comparison unit, which includes a transimpedance amplifier and a voltage comparator, can perform the comparing operation 1006. After the comparing operation 1006 is completed, control passes to latching operation 1008.

At latching operation 1008, the result of comparing the leakage current of the capacitor array to the threshold value is latched to a set-reset flip-flop. It is contemplated that other memory devices known to those skilled in the art may be used to store the comparison result. After the latching operation 1008 is completed, control passes to disconnecting operation 1010.

At disconnecting operation 1010, the capacitor array is disconnected from the power supply if the leakage current of the capacitor array is greater than the threshold value. This operation prevents the capacitor array from further acting as a decoupling capacitor array. By doing so, power consumption from leaky capacitor is decreased. Moreover, coupling and jitter problems for noise-sensitive devices are averted. After the disconnecting operation 1010 the testing cycle may end, or optionally, control passes to blowing operation 1012.

At blowing operation 1012, a fuse is blown if the leakage current of the capacitor array is greater than the threshold value. This operation permanently disconnects the leaky capacitor array from the power supply. Thus, even if the chip incorporating the capacitor array is turned off then on, the leaky capacitor array will remain disconnected from the power supply.

As mentioned above, sensing of the leakage current of the capacitor array is performed at repeated time intervals by a timer unit. Thus, leakage sensing of the capacitor or capacitor array is repeated at regular intervals.

The leakage sensor and switching system is designed to improve the reliability and yield of the deep-trench capacitor arrays. Thus, the present invention beneficially allows for the design of a high-density deep trench capacitor array comprising a plurality of individually detachable modules. Each array module comprises a plurality of deep-trench capacitors that are electrically connected in parallel as a unit. It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A capacitor tester comprising:
    a current mirror configured to selectively sense a leakage current of at least one capacitor;
    a comparison unit comprising a transimpedance amplifier and a voltage comparator configured to determine if the leakage current is above a threshold value;
    a timer unit configured to schedule sensing by the current mirror;
    a heater proximate to at least one of the plurality of capacitors, the heater configured to selectively heat at least one capacitor during sensing; and
    a switch unit to disconnect the at least one capacitor from a source if the leakage current is above the threshold value;
    wherein the current mirror comprises a first pFET including a first source, a first gate, and a first drain, the first source coupled to a supply voltage, the first gate coupled to a normal signal, and the first drain coupled to the at least one capacitor;
    wherein the current mirror further comprises a second pFET including a second source, a second gate, and a second drain, the second source coupled to the normal signal, and the second gate coupled to the timer unit;
    wherein the current mirror further comprises a third pFET including a third source, a third gate, and a third drain, the third source coupled to the first drain, the third gate coupled to the timer unit, and the third drain coupled to the first gate and the second source; and
    wherein the current mirror further comprises a secondary-side pFET including a secondary-side source, secondary-side gate, and secondary-side drain, the secondary-side source coupled to the supply voltage, the secondary-side gate coupled to the second drain, and the secondary-side drain coupled to the comparison unit.

2. The capacitor tester of claim 1, further comprising a set-reset latch coupled to the switch unit, the set-reset latch storing a leaky state or a not-leaky state of the at least one capacitor such that once the capacitor is determined to be leaky it is continuously disconnected from the charge source until the set-reset latch is reset.

3. The capacitor tester of claim 1, wherein the timer circuit provides a control pulse to activate the current mirror.

4. The capacitor tester of claim 1, wherein the heater is configured to heat the capacitor to a temperature between 80° C. and 130° C. during leakage current sensing.

5. The capacitor tester of claim 4, wherein the heater is a resistor having a serpentine pattern.

6. An on-chip power decoupling system comprising:
    a plurality of capacitor arrays, each capacitor array including a plurality of deep trench capacitors coupled in parallel circuit to a power supply;
    a sensing unit for the detection of leakage current in the plurality of capacitor arrays, the sensing unit including a plurality of current mirrors configured to sense the leakage current of each of the plurality of capacitor arrays;
    a switch unit for disconnecting a capacitor array of the plurality of capacitor arrays from the power supply if the capacitor array is leaky;
    a plurality of heaters proximate to each of the plurality of capacitor arrays, the heaters configured to selectively heat the proximate capacitor array during sensing;
    wherein each current mirror in the plurality of current mirrors further comprises a first pFET including a first source, a first gate, and a first drain, the first source coupled to a supply voltage, the first gate coupled to a normal signal, and the first drain coupled to at least one capacitor array;
    wherein each current mirror in the plurality of current mirrors further comprises a second pFET including a second source, a second gate, and a second drain, the second source coupled to the normal signal, and the second gate coupled to the timer unit;
    wherein each current mirror in the plurality of current mirrors further comprises a third pFET including a third source, a third gate, and a third drain, the third source coupled to the first drain, the third gate coupled to the timer unit, and the third drain coupled to the first gate and the second source; and
    wherein each current mirror in the plurality of current mirrors further comprises a secondary-side pFET including a secondary-side source, secondary-side gate, and secondary-side drain, the secondary-side source coupled to the supply voltage, the secondary-side gate coupled to the second drain, and the secondary-side drain coupled to the comparison unit.

7. The on-chip power decoupling system of claim 6, wherein the sensing unit comprises:
   a comparison unit comprising a transimpedance amplifier and a voltage comparator configured to determine if the leakage current is above a threshold value; and
   a timer unit configured to schedule sensing of each of the plurality of capacitor arrays by the current mirror.

8. The on-chip power decoupling system of claim 7, wherein the timer unit provides a control pulse to activate the current mirror.

9. The on-chip power decoupling system of claim 6, further comprising a set-reset latch storing a leaky state or a not-leaky state of the at least one capacitor.

10. The on-chip power decoupling system of claim 6, wherein the switch unit comprises an electronic fuse configured to permanently disconnect a capacitor array of the plurality of capacitor arrays from the power supply if the leakage current of the capacitor array is above the threshold value.

11. The on-chip power decoupling system of claim 6, wherein the heaters are configured to heat each of the plurality of capacitor arrays to a temperature above 75° C. during leakage current sensing.

12. The on-chip power decoupling system of claim 6, wherein the heaters are resistors having a serpentine pattern.

13. A method for operating an on-chip power decoupling system, the method comprising:
   heating at least one capacitor array;
   sensing a leakage current of the capacitor array via a current mirror circuit, the capacitor array including a plurality of capacitors coupled in parallel circuit to a power supply;
   comparing the leakage current of the capacitor array to a threshold value; and
   disconnecting the capacitor array from the power supply if the leakage current of the capacitor array is greater than the threshold value; and
   wherein the current mirror comprises a first pFET including a first source, a first gate, and a first drain, the first source coupled to a supply voltage, the first gate coupled to a normal signal, and the first drain coupled to the at least one capacitor;
   wherein the current mirror further comprises a second pFET including a second source, a second gate, and a second drain, the second source coupled to the normal signal, and the second gate coupled to the timer unit;
   wherein the current mirror further comprises a third pFET including a third source, a third gate, and a third drain, the third source coupled to the first drain, the third gate coupled to the timer unit, and the third drain coupled to the first gate and the second source; and
   wherein the current mirror further comprises a secondary-side pFET including a secondary-side source, secondary-side gate, and secondary-side drain, the secondary-side source coupled to the supply voltage, the secondary-side gate coupled to the second drain, and the secondary-side drain coupled to the comparison unit.

14. The method of claim 13, further comprising latching in a flip-flop a result of comparing the leakage current of the capacitor array to the threshold value.

15. The method of claim 13, wherein the sensing of the leakage current of the at least one capacitor array is performed at repeated time intervals.

16. The method of claim 13, blowing a fuse if the leakage current of the capacitor array is greater than the threshold value such that the capacitor array is permanently disconnected from the power supply.

* * * * *